United States Patent
Ma et al.

(10) Patent No.: US 9,445,496 B2
(45) Date of Patent: Sep. 13, 2016

(54) GLASS CLAD MICROELECTRONIC SUBSTRATE

(75) Inventors: Qing Ma, Saratoga, CA (US); Johanna M Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 409 days.

(21) Appl. No.: 13/993,340

(22) PCT Filed: Mar. 7, 2012

(86) PCT No.: PCT/US2012/028126
§ 371 (c)(1),
(2), (4) Date: Sep. 16, 2013

(87) PCT Pub. No.: WO2013/133827
PCT Pub. Date: Sep. 12, 2013

(65) Prior Publication Data
US 2014/0003009 A1    Jan. 2, 2014

(51) Int. Cl.
*H05K 5/00* (2006.01)
*H05K 1/00* (2006.01)
*H05K 1/11* (2006.01)
(Continued)

(52) U.S. Cl.
CPC ....... *H05K 1/0306* (2013.01); *H01L 23/49816* (2013.01); *H01L 23/49822* (2013.01); *H01L 23/49827* (2013.01); *H01L 23/49894* (2013.01); *H05K 3/40* (2013.01); *H01L 24/16* (2013.01); *H01L 2224/131* (2013.01); *H01L 2224/13111* (2013.01); *H01L 2224/16238* (2013.01); *H01L 2224/81192* (2013.01); *H01L 2924/00013* (2013.01); *H01L 2924/12042* (2013.01); *Y10T 29/49147* (2015.01)

(58) Field of Classification Search
CPC ............................. H05K 1/0306; H05K 3/40
USPC .................. 174/258, 260, 262–266; 361/757
See application file for complete search history.

(56) References Cited

U.S. PATENT DOCUMENTS 4,221,047 A    9/1980    Narken et al.
4,327,143 A    4/1982    Alvino et al.
(Continued)

FOREIGN PATENT DOCUMENTS

CN    101542719 A    9/2009
EP    1 164 823 A3    9/2003
(Continued)

OTHER PUBLICATIONS

Office Action received for Taiwanese Patent Application No. 099136723, mailed on May 26, 2014, 29 pages of Office Action Including 17 pages of English Translation.
(Continued)

*Primary Examiner* — Sherman Ng
(74) *Attorney, Agent, or Firm* — Winkle, PLLC

(57) ABSTRACT

Embodiments of the present description relate to the field of fabricating microelectronic substrates. The microelectronic substrate may include a trace routing structure disposed between opposing glass layers. The trace routing structure may comprise one or more dielectric layers having conductive traces formed thereon and therethrough. Also disclosed are embodiments of a microelectronic package including a microelectronic device disposed proximate one glass layer of the microelectronic substrate and coupled with the microelectronic substrate by a plurality of interconnects.

30 Claims, 15 Drawing Sheets

(51) Int. Cl.

| | |
|---|---|
| *H05K 1/03* | (2006.01) |
| *H01L 23/498* | (2006.01) |
| *H05K 3/40* | (2006.01) |
| *H01L 23/00* | (2006.01) |

(56) References Cited

U.S. PATENT DOCUMENTS

| | | | |
|---|---|---|---|
| 4,379,553 A | 4/1983 | Kelly | |
| 4,622,058 A * | 11/1986 | Leary-Renick | H01L 21/48 |
| | | | 216/65 |
| 4,639,543 A | 1/1987 | Fang | |
| 4,664,309 A | 5/1987 | Allen et al. | |
| 4,672,152 A * | 6/1987 | Shinohara | C03C 10/0027 |
| | | | 174/258 |
| 4,828,597 A | 5/1989 | Glascock, II et al. | |
| 4,975,103 A | 12/1990 | Ackermann et al. | |
| 5,193,668 A | 3/1993 | Fukuchi et al. | |
| 5,294,238 A | 3/1994 | Fukada | |
| 5,466,488 A | 11/1995 | Toyoda et al. | |
| 5,585,675 A | 12/1996 | Knopf | |
| 5,611,876 A | 3/1997 | Newton et al. | |
| 5,612,171 A | 3/1997 | Bhagavatula | |
| 5,668,405 A | 9/1997 | Yamashita | |
| 5,705,855 A | 1/1998 | Carson et al. | |
| 5,917,652 A | 6/1999 | Mathers et al. | |
| 5,981,880 A | 11/1999 | Appelt et al. | |
| 6,023,098 A | 2/2000 | Higashiguchi et al. | |
| 6,037,656 A | 3/2000 | Sugahara | |
| 6,156,413 A | 12/2000 | Tomari et al. | |
| 6,177,707 B1 | 1/2001 | Dekker et al. | |
| 6,194,762 B1 | 2/2001 | Yamazaki et al. | |
| 6,309,901 B1 | 10/2001 | Tahon et al. | |
| 6,320,547 B1 | 11/2001 | Fathy et al. | |
| 6,329,610 B1 | 12/2001 | Takubo et al. | |
| 6,339,197 B1 | 1/2002 | Fushie et al. | |
| 6,413,620 B1 * | 7/2002 | Kimura | H05K 3/20 |
| | | | 174/251 |
| 6,468,447 B2 * | 10/2002 | Matsumoto | C03C 8/18 |
| | | | 174/257 |
| 6,534,723 B1 | 3/2003 | Asai et al. | |
| 6,539,750 B1 | 4/2003 | Takagi et al. | |
| 6,673,698 B1 | 1/2004 | Lin et al. | |
| 6,691,409 B2 | 2/2004 | Suzuki et al. | |
| 6,772,514 B2 | 8/2004 | Ogura et al. | |
| 6,781,064 B1 | 8/2004 | Appelt et al. | |
| 6,799,438 B2 | 10/2004 | Herzbach et al. | |
| 6,839,946 B2 | 1/2005 | Ylilammi et al. | |
| 6,894,358 B2 | 5/2005 | Leib et al. | |
| 6,989,604 B1 | 1/2006 | Woo et al. | |
| 7,038,309 B2 | 5/2006 | Hsu et al. | |
| 7,071,521 B2 | 7/2006 | Leib et al. | |
| 7,072,018 B2 | 7/2006 | Yamamura et al. | |
| 7,091,589 B2 | 8/2006 | Mori et al. | |
| 7,164,572 B1 | 1/2007 | Burdon et al. | |
| 7,176,131 B2 | 2/2007 | Meyer-Berg et al. | |
| 7,259,080 B2 | 8/2007 | Quenzer et al. | |
| 7,279,771 B2 | 10/2007 | Sunohara et al. | |
| 7,285,834 B2 | 10/2007 | Leib et al. | |
| 7,307,852 B2 | 12/2007 | Inagaki et al. | |
| 7,337,540 B2 | 3/2008 | Kurosawa | |
| 7,362,403 B2 | 4/2008 | Uehara | |
| 7,476,623 B2 | 1/2009 | Schreder et al. | |
| 7,749,900 B2 | 7/2010 | Li et al. | |
| 7,993,510 B2 | 8/2011 | En | |
| 8,207,453 B2 | 6/2012 | Ma et al. | |
| 2001/0042854 A1 | 11/2001 | Matsumoto | |
| 2002/0027282 A1 * | 3/2002 | Kawakami | C03C 3/062 |
| | | | 257/700 |
| 2002/0038725 A1 | 4/2002 | Suzuki et al. | |
| 2002/0046880 A1 | 4/2002 | Takubo et al. | |
| 2002/0145197 A1 | 10/2002 | Ohta et al. | |
| 2002/0159243 A1 | 10/2002 | Ogawa et al. | |
| 2002/0180015 A1 | 12/2002 | Yamaguchi et al. | |
| 2002/0182958 A1 | 12/2002 | Tani et al. | |
| 2003/0062111 A1 * | 4/2003 | Moriya | B32B 18/00 |
| | | | 156/89.12 |
| 2003/0063453 A1 | 4/2003 | Kusagaya et al. | |
| 2003/0066683 A1 | 4/2003 | Suzuki et al. | |
| 2004/0071960 A1 | 4/2004 | Weber et al. | |
| 2004/0137701 A1 | 7/2004 | Takao | |
| 2004/0151882 A1 | 8/2004 | Tani et al. | |
| 2004/0168825 A1 | 9/2004 | Sakamoto et al. | |
| 2004/0178492 A1 | 9/2004 | Tsukamoto et al. | |
| 2004/0217455 A1 | 11/2004 | Shiono et al. | |
| 2004/0239349 A1 | 12/2004 | Yamagishi et al. | |
| 2005/0012217 A1 | 1/2005 | Mori et al. | |
| 2005/0016764 A1 | 1/2005 | Echigo et al. | |
| 2005/0098882 A1 | 5/2005 | Kusagaya et al. | |
| 2005/0189136 A1 | 9/2005 | Kawasaki et al. | |
| 2005/0218503 A1 | 10/2005 | Abe et al. | |
| 2006/0005382 A1 | 1/2006 | Hsien | |
| 2006/0043572 A1 | 3/2006 | Sugimoto et al. | |
| 2006/0191708 A1 | 8/2006 | Kawasaki et al. | |
| 2006/0191710 A1 | 8/2006 | Fushie et al. | |
| 2006/0201201 A1 | 9/2006 | Fushie et al. | |
| 2006/0201818 A1 | 9/2006 | Fushie et al. | |
| 2006/0244128 A1 | 11/2006 | Hayashi et al. | |
| 2006/0255816 A1 | 11/2006 | Shioga et al. | |
| 2006/0255817 A1 | 11/2006 | Yamagishi | |
| 2006/0261364 A1 | 11/2006 | Suehiro et al. | |
| 2006/0289968 A1 | 12/2006 | Sulfridge | |
| 2007/0060970 A1 | 3/2007 | Burdon et al. | |
| 2007/0096328 A1 | 5/2007 | Takahashi et al. | |
| 2007/0119619 A1 | 5/2007 | Nakamura et al. | |
| 2007/0154741 A1 | 7/2007 | Takahashi et al. | |
| 2007/0175025 A1 | 8/2007 | Tsukamoto et al. | |
| 2007/0186414 A1 | 8/2007 | Abe et al. | |
| 2007/0227765 A1 | 10/2007 | Sakamoto et al. | |
| 2007/0230151 A1 | 10/2007 | Hayashi et al. | |
| 2007/0257356 A1 | 11/2007 | Abe et al. | |
| 2007/0267138 A1 | 11/2007 | White et al. | |
| 2008/0073110 A1 * | 3/2008 | Shioga | H05K 1/162 |
| | | | 174/258 |
| 2008/0107863 A1 | 5/2008 | Ikeda et al. | |
| 2008/0149384 A1 | 6/2008 | Kawabe | |
| 2008/0152928 A1 | 6/2008 | Miyauchi et al. | |
| 2008/0164057 A1 | 7/2008 | Mori et al. | |
| 2008/0217748 A1 | 9/2008 | Knickerbocker | |
| 2008/0261005 A1 | 10/2008 | Nomiya et al. | |
| 2008/0277148 A1 | 11/2008 | Asai et al. | |
| 2008/0283277 A1 | 11/2008 | Muramatsu et al. | |
| 2008/0283282 A1 | 11/2008 | Kawasaki et al. | |
| 2009/0001550 A1 | 1/2009 | Li et al. | |
| 2009/0159316 A1 | 6/2009 | Kuramochi | |
| 2009/0174065 A1 | 7/2009 | Hayashi et al. | |
| 2009/0183910 A1 | 7/2009 | Sunohara | |
| 2009/0243065 A1 | 10/2009 | Sugino et al. | |
| 2009/0273073 A1 | 11/2009 | Tachibana et al. | |
| 2009/0293271 A1 | 12/2009 | Tanaka | |
| 2009/0294161 A1 | 12/2009 | Yoshimura et al. | |
| 2010/0006328 A1 | 1/2010 | Kawasaki et al. | |
| 2010/0019382 A1 | 1/2010 | Miwa et al. | |
| 2010/0032826 A1 | 2/2010 | Tachibana et al. | |
| 2010/0164030 A1 | 7/2010 | Oggioni et al. | |
| 2011/0101399 A1 | 5/2011 | Suehiro et al. | |
| 2011/0147055 A1 | 6/2011 | Ma et al. | |
| 2011/0147059 A1 | 6/2011 | Ma et al. | |
| 2011/0233786 A1 | 9/2011 | Homma et al. | |
| 2012/0106117 A1 | 5/2012 | Sundaram et al. | |
| 2012/0192413 A1 | 8/2012 | Ma et al. | |
| 2012/0305303 A1 * | 12/2012 | Hossain | H01L 23/49838 |
| | | | 174/260 |
| 2014/0085846 A1 | 3/2014 | Ma et al. | |

FOREIGN PATENT DOCUMENTS

| | | |
|---|---|---|
| EP | 1 298 972 A3 | 8/2005 |
| JP | 06-237081 A | 8/1994 |
| JP | 2000-119047 A | 4/2000 |
| JP | 2001-053191 A | 2/2001 |
| JP | 2003-142804 A | 5/2003 |
| JP | 2005-005488 A | 1/2005 |

(56) References Cited

FOREIGN PATENT DOCUMENTS

| | | |
|---|---|---|
| JP | 2006-275954 A | 10/2006 |
| JP | 2009-176791 A | 8/2009 |
| JP | 2009-302506 A | 12/2009 |
| KR | 100701205 B1 | 3/2007 |
| WO | 2011/084216 A2 | 7/2011 |
| WO | 2011/084235 A2 | 7/2011 |
| WO | 2011/084216 A3 | 9/2011 |
| WO | 2011/084235 A3 | 9/2011 |
| WO | 2013/133827 A | 9/2013 |

OTHER PUBLICATIONS

Office Action received for Chinese Patent Application No. 2010800571898, mailed on May 4, 2014, 16 pages of Office Action Including 9 pages of English Translation.

Office Action received for Chinese Patent Application No. 201080058105.2, mailed on Jun. 3, 2014, 17 pages of Office Action including 4 pages of English Translation.

Office Action received for Korean Patent Application 2014-7005894, mailed on Jun. 3, 2014, 2 pages of English Translation only.

Office Action received for Korean Patent Application No. 2014-7005894, mailed on Oct. 21, 2014, 6 pages of Office Action including 3 pages of English Translation.

International Preliminary Report on Patentability and Written Opinion received for PCT Patent Application No. PCT/US2012/028126, mailed on Sep. 18, 2014, 8 pages.

Schott Hermes, "NEC Schott" Components Corporation Japan, Copyright 2009, 1 page.

Onezawa et al., "NEC Schott introduces Glass Substrates with Hermetic Metal Through Vias for WLP of MEMS & Sensor applications", Aug. 7, 2009.

International Preliminary Report on Patentability Received for PCT Patent Application No. PCT/US2010/054931, mailed on Jun. 28, 2012, 7 pages.

International Search Report and Written Opinion Received for PCT Patent Application No. PCT/US2010/054931, mailed on Jun. 30, 2011, 9 pages.

International Preliminary Report on Patentability Received for PCT Patent Application No. PCT/US2010/056310, mailed on Jun. 28, 2012, 7 pages.

International Search Report Received for PCT Patent Application No. PCT/US2010/056310, mailed on Jun. 30, 2011, 9 pages.

International Search Report and written Opinion Received for PCT Patent Application No. PCT/US2012/28126, mailed on Nov. 30, 2012, 11 pages.

"Mems Tightly Sealed With Schott Hermes", SCHOTT Electronic Packaging, Jul. 30, 2009.

"Schott Hermes Substrate", Webpage (Retrieved Dec. 9, 2009), available at: http://www.nec-schott.co.jp/english/auto/others/hermes.html?PHPSESSID=r4nmcg11d95hgugh5r253hq3d3.

Office Action Received for Taiwan Patent Application No. 099137777, mailed on Dec. 19, 2013, 9 pages of Office Action including 4 pages of English Translation.

Office Action received for German Patent Application No. 112010004888.6, mailed on Jul. 16, 2013, 5 pages of Office Action only.

Office Action received for German Patent Application No. 112010004890.8, mailed on Jul. 23, 2013, 7 pages of Office Action only.

Office Action received for United Kingdom Patent Application No. 1208343.2, mailed on Aug. 22, 2013 3 pages.

Office Action received for Japanese Patent Application No. 2012-542016, mailed on Jun. 25, 2013, 7 pages of Office Action Including 4 page of English Translation.

Office Action received for Korean Patent Application No. 2012-7015462, mailed on Feb. 26, 2014, 2 pages of English Translation only.

Office Action received for Korean Patent Application No. 2012-7015462, mailed on Aug. 19, 2013, 5 pages of English Translation only.

Notice of Allowance received for Korean Patent Application No. 2012-7015587, mailed on Apr. 9, 2014 3 pages of NOA including 1 page of English Translation.

Office Action Received for Korean Patent Application No. 2012-7015587, mailed on Jun. 25, 2013, 4 pages of English Translation only.

Office Action received for Korean Patent Application No. 2012-7015587, mailed on Feb. 3, 2014, 3 pages of English Translation only.

Office Action received for United Kingdom Patent Application No. 1208343.2, mailed on Dec. 19, 2013, 4 pages.

\* cited by examiner

GLASS CLAD MICROELECTRONIC SUBSTRATE

BACKGROUND

Embodiments of the present description generally relate to the field of microelectronic substrates, which may be used in the assembly of microelectronic packages, and processes for fabricating the same.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
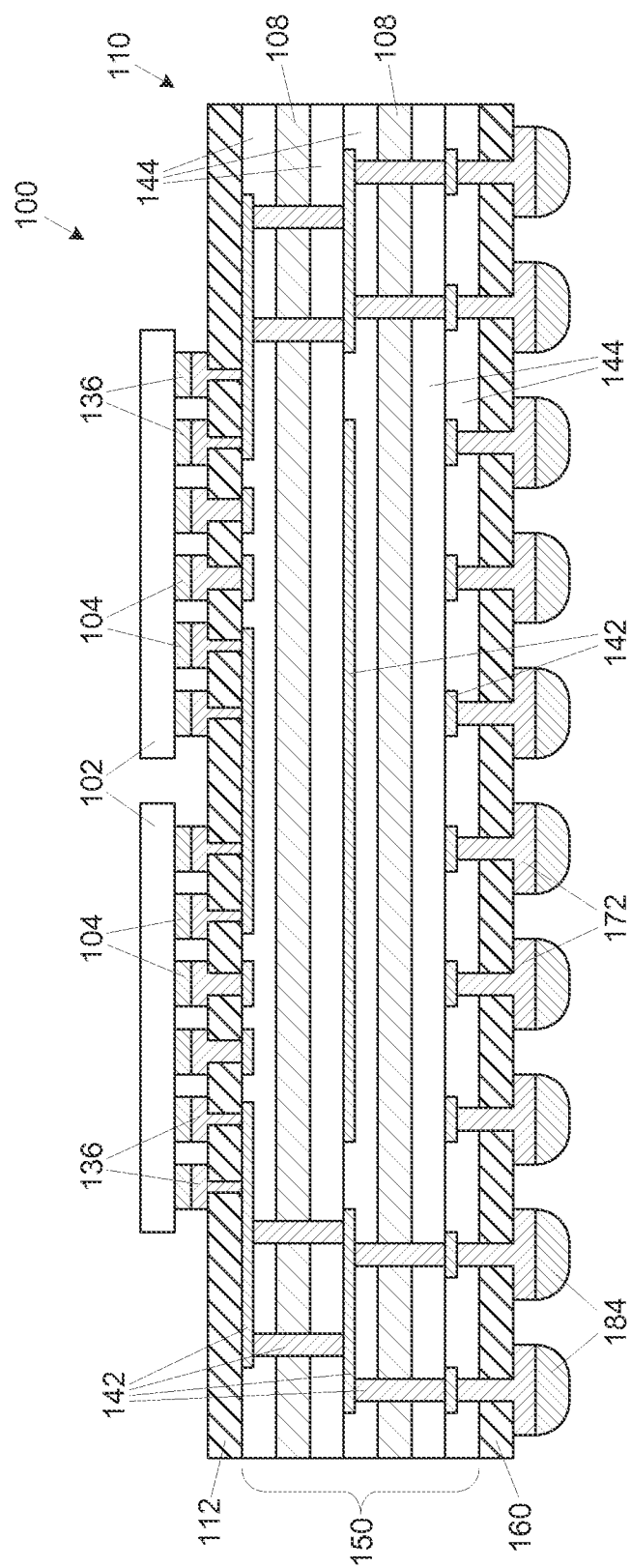
FIG. 1 illustrates a side cross-sectional view of at least one microelectronic device mounted on a microelectronic substrate, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing front the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing front the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic substrates. The microelectronic substrates may include a trace routing structure disposed between opposing glass layers. The trace routing structure may comprise one or more dielectric layers having conductive traces formed thereon and therethrough. Also disclosed are embodiments of a microelectronic package including at least one microelectronic device disposed proximate one glass layer of the microelectronic substrate and coupled with the microelectronic substrate by a plurality of interconnects.

As noted above, the disclosed embodiments encompass a microelectronic substrate including a trace routing structure disposed between opposing glass layers. According to one embodiment of the present description, the term "glass" refers to an amorphous solid. Examples of glass materials that may be used with the described embodiments include substantially pure silica (e.g., approximately 100% $SiO_2$), soda-lime glass, boro-silicate glass, and alumo-silicate glass. However, the disclosed embodiments are not limited to silica-based glass compositions, and glasses having alternative base materials (e.g. fluoride glasses, phosphate glasses, chalcogen glasses, etc.) may also be employed with the disclosed embodiments. Further, any combination of other materials and additives may be combined with silica (or other base material) to form a glass having desired physical properties. Examples of these additives include not only the aforementioned calcium carbonate (e.g., lime) and sodium carbonate (e.g., soda), but also magnesium, calcium, manganese, aluminum, lead, boron, iron, chromium, potassium, sulfur, and antimony, as well as carbonates and/or oxides of these and other elements. The aforementioned glasses and additives are but a few examples of the many types of materials and material combinations that may find application with the disclosed embodiments. In addition, a glass layer or structure may include surface treatments and/or coatings to improve strength and/or durability. Furthermore, a glass layer or structure may also be annealed to lower internal stresses.

Generally, as used herein, the term "glass" does not refer to organic polymer materials, which may be amorphous in solid form. However, it should be understood that a glass according to some embodiments may include carbon as one of the material's constituents. For example, soda-lime glass, as well as numerous variations of this type of glass type, includes carbon.

In the production of microelectronic packages, microelectronic devices are generally mounted on microelectronic substrates, which provide electrical communication routes between the microelectronic devices and external components. As shown in FIG. 1, at least one microelectronic device 102, such as a microprocessor, a chipset, a graphics device, a wireless device, a memory device, an application specific integrated circuit, or the like, may be electrically attached to a microelectronic substrate 110. According to one embodiment of the present description, the microelectronic substrate 110 may comprise a trace routing structure 150 disposed between a first glass layer 112 and an opposing second glass layer 160. The trace routing structure 150 may comprise one or more dielectric layers 144 having conductive traces 142 formed thereon and therethrough. The trace routing structure 150 may further include at least one source/ground layer 108 disposed therein, as will be understood to those skilled in the art.

Device-to-substrate interconnects 104 may extend between bond pads (not shown) the microelectronic device 102 and substantially mirror-image first through-glass contact structures 136 extending through the first glass layer 112. The microelectronic device bond pads (not shown) may be in electrical communication with integrated circuitry (not shown) within the microelectronic device 102. The first through-glass contact structures 136 may be in electrical contact with at least one conductive trace 142.

The device-to-substrate interconnects 104 may be reflowable solder bumps or balls, in a configuration generally known as a flip-chip or controlled collapse chip connection ("C4") configuration, as shown. However, the device-to-substrate interconnects 104 may be pins, lands, or bond wires, as known in the art.

The microelectronic substrate 110 may further include at least one second through-glass contact structure 172 extending through the second glass layer 160 to contact at least one conductive trace 142. As shown, the second through-glass contact structures 172 may extend into a dielectric layer (e.g. element 144 abutting the second glass layer 160) to contact at least one conductive trace 142. An external interconnect 184 may be formed on each of the second through-glass contact structures 172. The external interconnects 184 may be reflowable solder bumps or balls, pins, or lands, as known in the art. When solder balls or bumps are used to forming the device-to-substrate interconnects 104 and/or the external interconnects 184, the solder any appropriate material, including, but not limited to, lead/tin alloys and high tin content alloys (e.g. 90% or more tin), and similar alloys.

Figure 2:
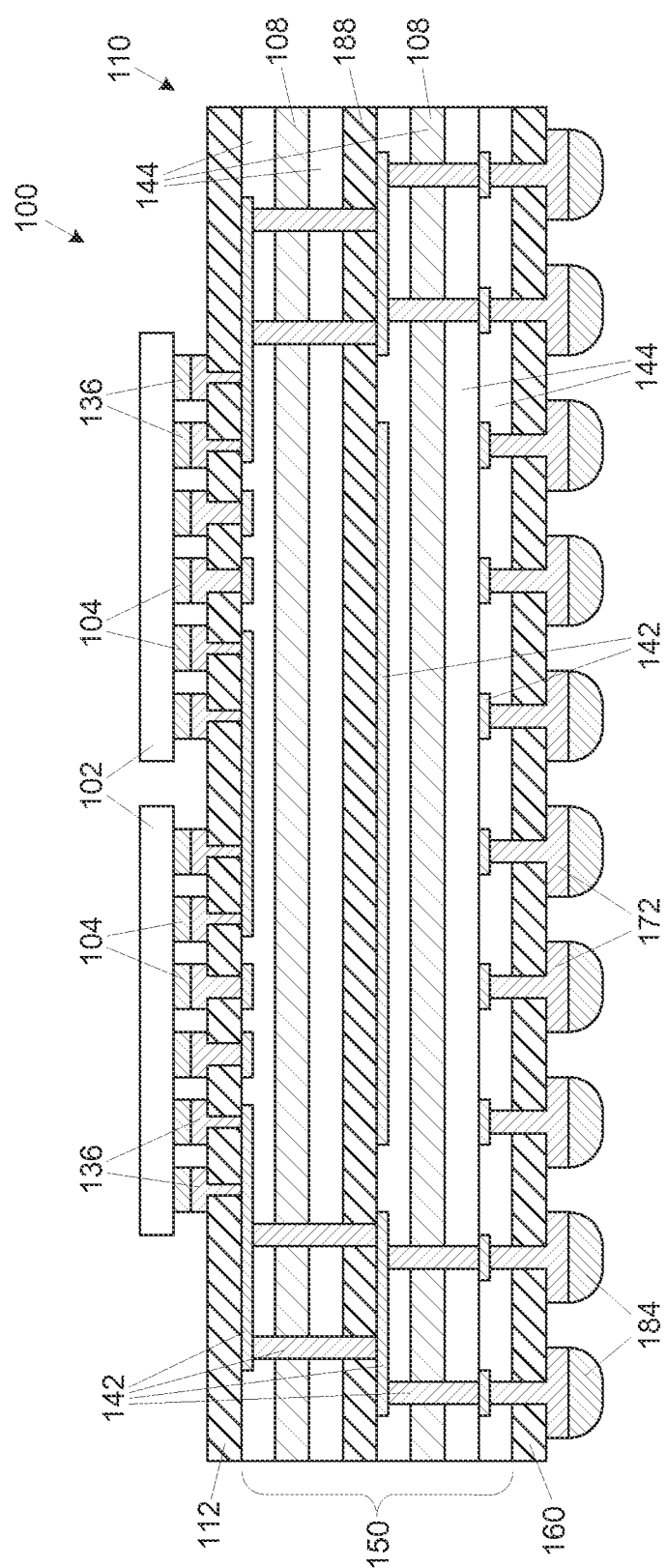
FIG. 2 illustrates a side cross-sectional view of at least one microelectronic device mounted on a microelectronic substrate, according to another embodiment of the present description.

In another embodiment of the present description as shown in FIG. 2, the trace routing structure 150 may include at least one additional glass layer 188 disposed therein.

The microelectronic substrate 110 embodiments of the present description, such as shown in FIGS. 1 and 2, may enable high density traces (such as 2/2 μm or finer line/spacing) for interconnection between microelectronic devices 102 and for escape traces, as will be understood to those skilled in the art. Furthermore, they may achieve ultra-thinness, for example, between about 100 and 200 μm in thickness. Moreover, they may achieve high flatness as a result of stress balancing between the opposing glass layers (i.e. elements 112 and 160). Additional benefits may include hermeticity from impermeability of the glass layers (i.e. elements 112 and 160), which may improve reliability and may enable the application of low-K, low loss dielectric materials, which may be moisture sensitive.

Figure 3A:
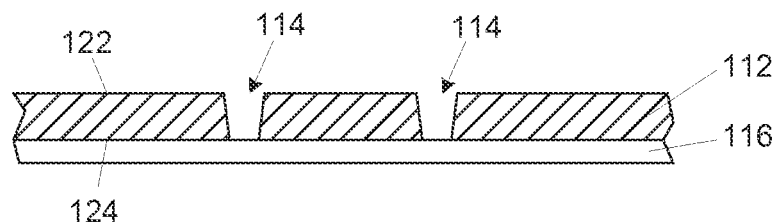
FIGS. 3A-3Q illustrate side cross-sectional views of fabricating a substrate, according to an embodiment of the present description.
Figure 3B:
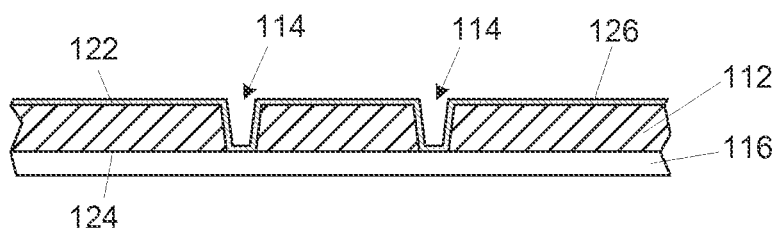
Figure 3C:
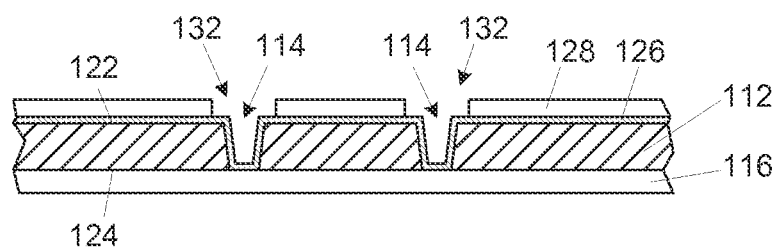
Figure 3D:
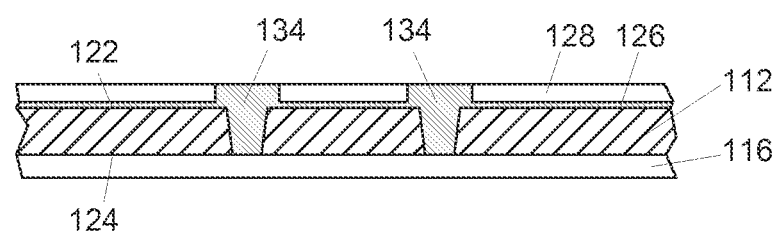
Figure 3E:
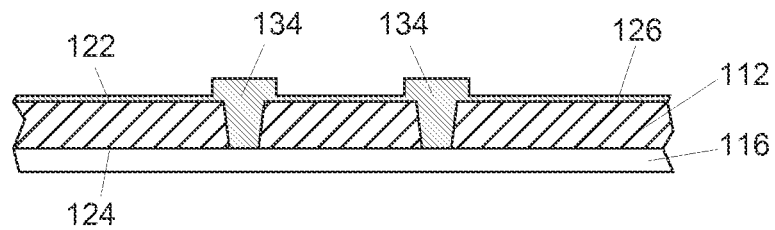
Figure 3F:
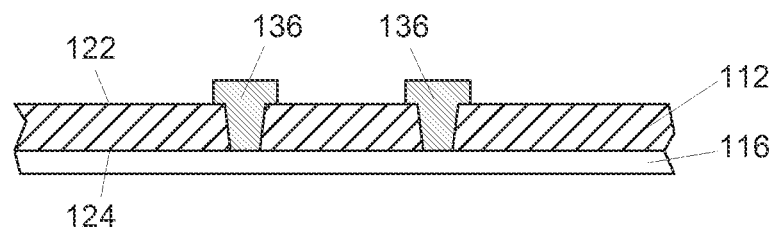
Figure 3G:
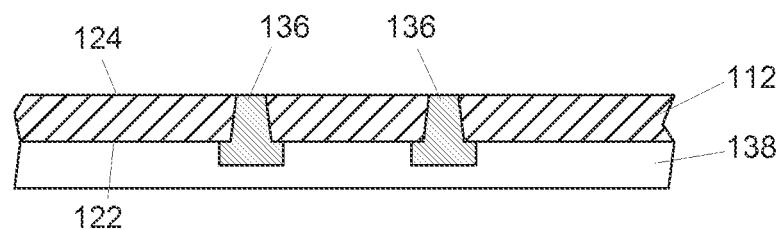
Figure 3H:
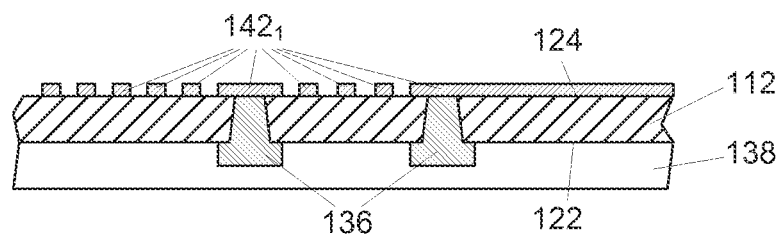
Figure 3I:
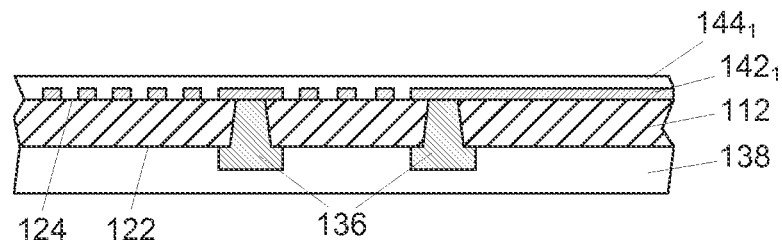
Figure 3J:
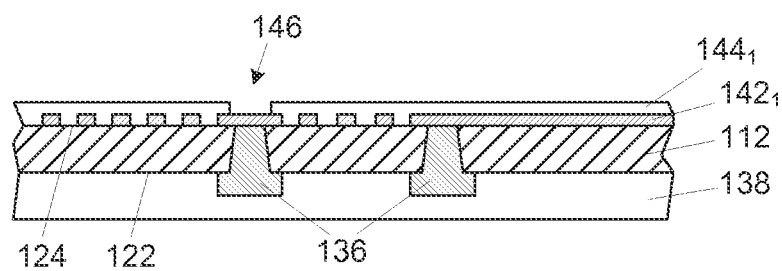
Figure 3K:
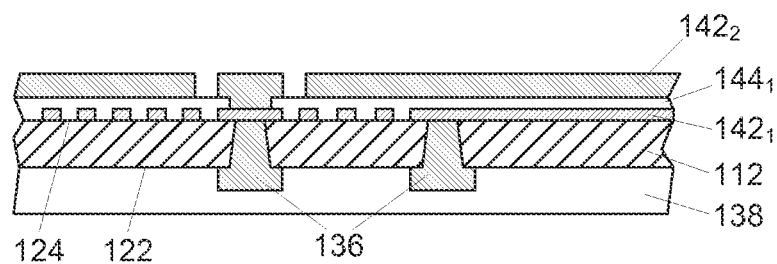
Figure 3L:
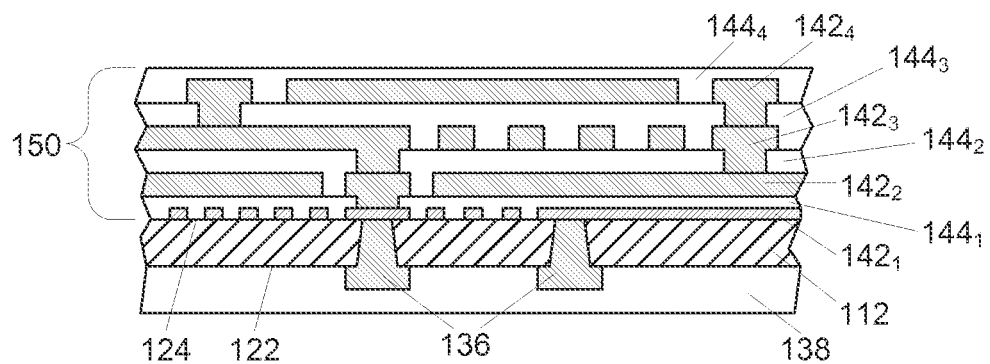
Figure 3M:
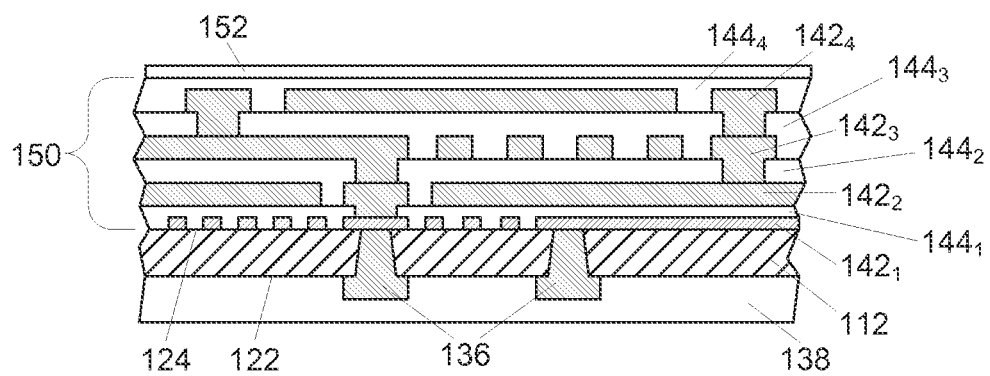
Figure 3N:
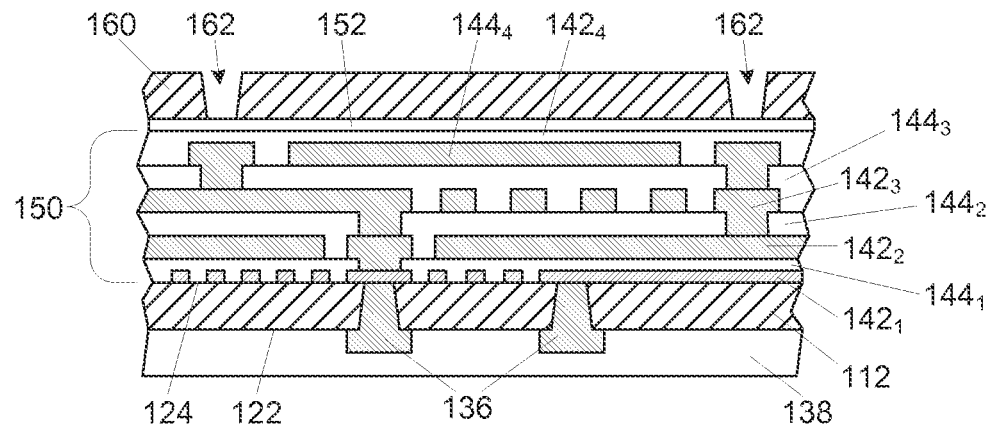
Figure 3O:
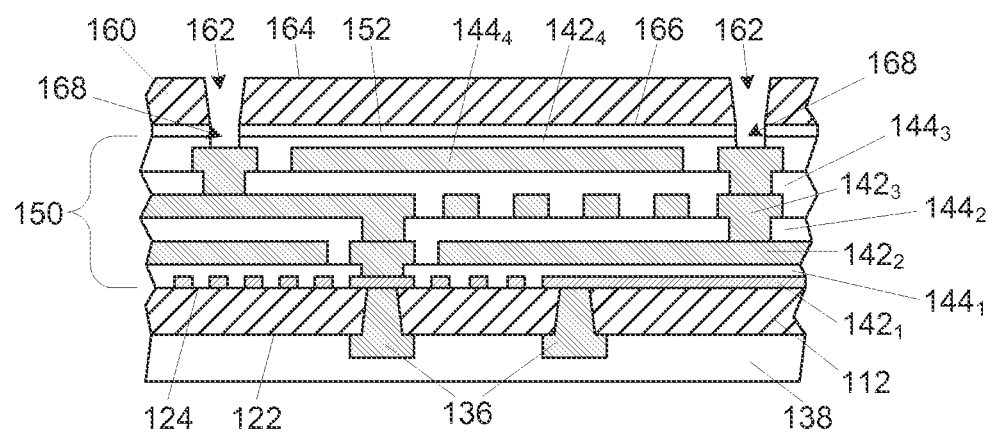
Figure 3P:
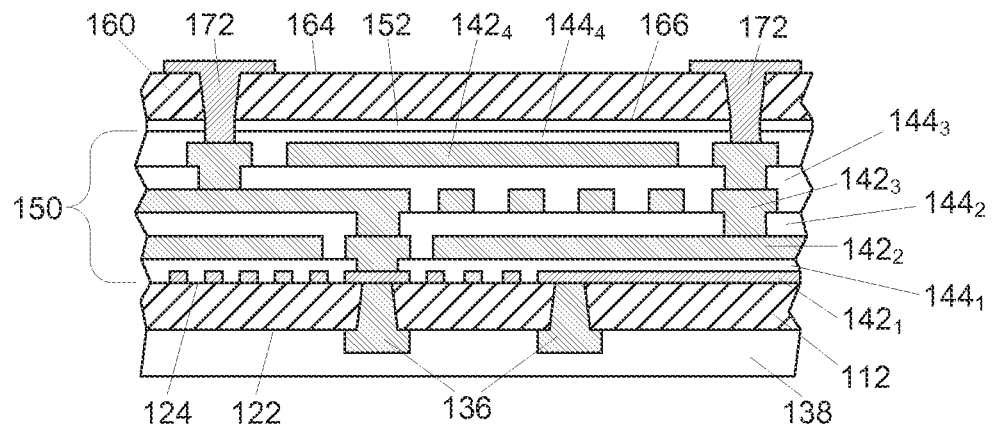
Figure 3Q:
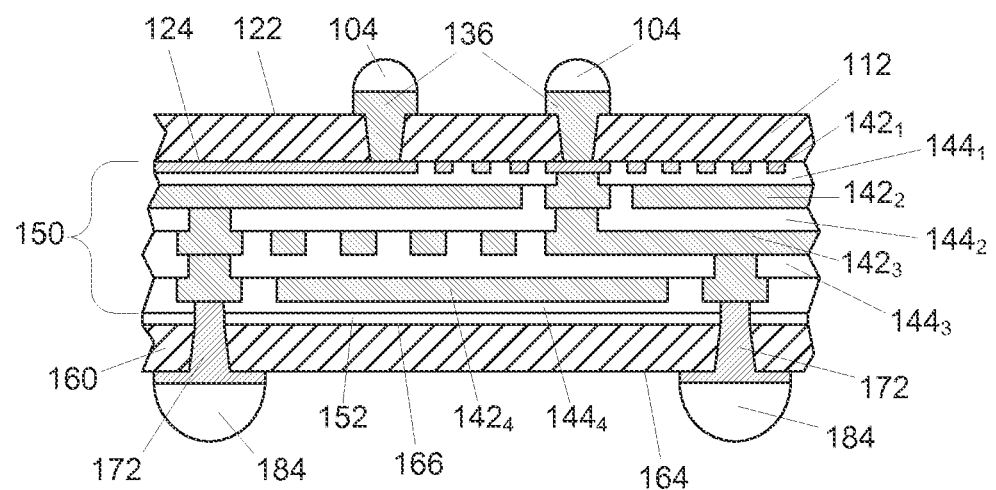

FIGS. 3A-3Q illustrate a method of fabricating a microelectronic substrate, according to one embodiment of the present description. As shown in FIG. 3A, a first glass layer 112 may be provided having at least one opening 114 extending therethrough from a first surface 122 of the first glass layer 112 to an opposing second surface 124 of the first glass layer 112. The first glass layer 112 may attached to a first carrier film 116, as also shown in FIG. 3A. The first glass layer openings 114 may be formed by any technique known in the art, including but not limited to imprinting, sand blasting, laser drilling, etching, and the like.

As shown in FIG. 3B, a precursor layer 126 may be formed over the first glass layer 112 and into the first glass layer opening 114. The precursor layer 126 may be a plurality of layers including but not limited to an adhesion layer, a seed layer, and the like. In one embodiment, the titanium adhesion layer may be sputter deposited over the first glass layer 112 and into the first glass layer opening 114, and a copper seed layer may be sputter deposited over the titanium adhesion layer. As shown in FIG. 3C, a mask 128 may be patterned with openings 132 over the first glass layer openings 114. A conductive material 134 may then be plated to fill the first glass layer opening 114 and the precursor layer 126 may be subsumed into the conductive material 134, as shown in FIG. 3D. As shown in FIG. 3E, the mask 128 (see FIG. 3D) may be removed, and, as shown in FIG. 3F, the conductive material 134 and the precursor layer 126 (see FIG. 3E) may be etched to remove the precursor layer 126 (see FIG. 3E) to form at least one first through-glass contact structure 136.

As shown in FIG. 3G, the first carrier film 116 (see FIG. 3F) may be removed from the first glass layer second surface 124, the first glass layer 112 may be flipped, and a second carrier film 138 may be place adjacent the first glass layer first surface 122. As shown in FIG. 3H, first level conductive traces $142_1$ may be patterned on the first glass layer second surface 124, wherein at least one of the first level conductive trace $142_1$ electrically contacts each first through-glass contact structure 136.

A first level dielectric layer $144_1$ may be formed over the first level conductive trace $142_1$, as shown in FIG. 3I, and a plurality of openings 146 may be formed through the first level dielectric layer $144_1$ to expose portions of the first level conductive traces $142_1$, as shown in FIG. 3J.

As shown in FIG. 3K, second level conductive traces $142_2$ may be formed on the first level dielectric layer $144_1$, wherein at least one second level conductive trace $142_2$ may electrically contact at least one first level conductive trace $142_1$ through at least one first level dielectric layer opening 146. The process of forming conductive traces and dielectric layers is repeated until a desired number is achieved to form a trace routing structure 150 (shown as first level conductive traces $142_1$, first level dielectric layer $144_1$, second level conductive traces $142_2$, second level dielectric layer $144_2$, third level conductive traces $142_3$, third level dielectric layer $144_3$, fourth level conductive traces $142_4$, and fourth level dielectric layer $144_4$), as shown in FIG. 3L.

The conductive traces (e.g. elements $142_1$, $142_2$, $142_3$, and $142_4$) may be composed of any conductive material, including but not limited to metals, such as copper and aluminum, and alloys thereof. In one embodiment if the conductive traces (e.g., elements $142_1$, $142_2$, $142_3$, and $142_4$) are formed of copper or alloys thereof, a semi-addition process may be used, as will be understood to those skilled in the art. In another embodiment, if the conductive traces (e.g. elements $142_1$, $142_2$, $142_3$, and $142_4$) are formed of aluminum or alloys thereof, a subtractive process may be used, as will be understood to those skilled in the art. It is also understood diffusion barriers may be required, particularly with the use of copper.

The dielectric layers (e.g. elements $144_1$, $144_2$, $144_3$, and $144_4$) may be compose of any appropriate dielectric, including but not limited to silicon dioxide ($SiO_2$), silicon oxynitride ($SiO_xN_y$), and silicon nitride ($Si_3N_4$) and silicon carbide (SiC), as well as silica-filled epoxies and the like. In one embodiment, the dielectric layers are formed of silicon dioxide by a plasma enhance chemical vapor deposition process. In another embodiment, the dielectric layers are an organic dielectric that may be formed by printing or lamination. The openings (i.e. element 146) in the dielectric layers may be formed by dry etching, laser ablation, ion drilling, or the like.

As shown in FIG. 3M, an adhesive layer 152 may be disposed on the final level dielectric layer (illustrated as element 144₄), and a second glass layer 160 having at least one opening 162 extending therethrough from a first surface 164 of the second glass layer 160 to an opposing second surface 166 of the second glass layer 160, as shown in FIG. 3N. An opening 168 may be formed through the adhesive layer 152 and into the final level dielectric layer (illustrated as element 144₄) by etching through the second glass layer openings 162, to expose a portion of at least one final level conductive trace (illustrated as element 142₄), as shown in FIG. 3O.

As shown in FIG. 3P, at least one second through-glass contact structure 172 may be formed in the second glass opening 162 and the openings 168 through the adhesive layer 152 and into the final level dielectric layer (illustrated as element 144₄), such as by plating and patterning, as known in the art. The second through-glass contact structure 172 may include but is not limited to metals, such as copper, aluminum, and alloys thereof. The second carrier film 138 may be removed. The device-to-substrate interconnects 104 may then be formed on each of the first through-glass contact structures 136 and an external interconnect 184 may be formed on each of the second through-glass contact structures 172. Although the device-to-substrate interconnects 104 and the external interconnects 184 are shown as reflowable solder bumps or balls, they may be pins or lands, as known in the art.

Figure 4A:
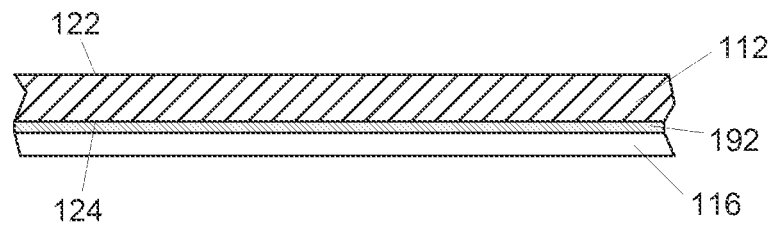
FIGS. 4A-4F illustrate side cross-sectional views of fabricating a substrate, according to another embodiment of the present description.
Figure 4B:
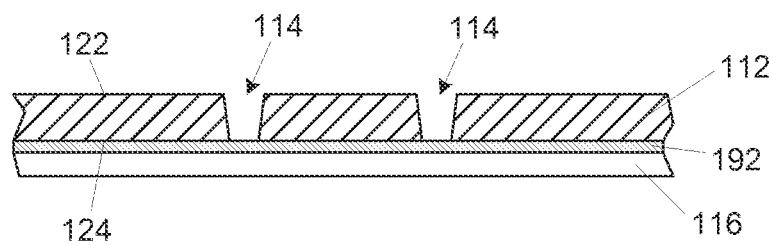

FIGS. 4A through 4E illustrate another embodiment of forming the first through-glass contact structures 136 and first level conductive traces 142₁. As shown in FIG. 4A, a first glass layer 112 may be provided with a first conductive material layer 192 abutting the first glass layer second surface 124 and the first carrier film 116 attached to the first conductive material layer 192. In one embodiment, the first conductive material 192 may be a metal sputter deposited and/or plated on the first glass layer 112. As shown in FIG. 4B, the first glass layer openings 114 may be formed to extend from the first glass layer first surface 122 to the opposing first glass layer second surface 124 to expose at least a portion of the first conductive material layer 192. In one embodiment, the first glass layer opening 114 may be formed by laser ablation, wherein the first conductive material layer 192 may act as a stop for the laser ablation.

Figure 4C:
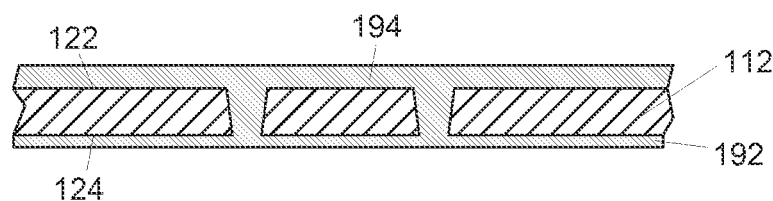
Figure 4D:
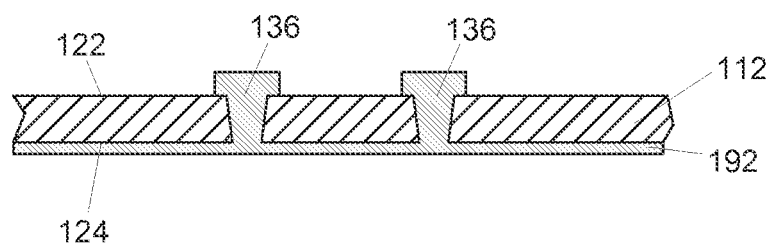
Figure 4E:
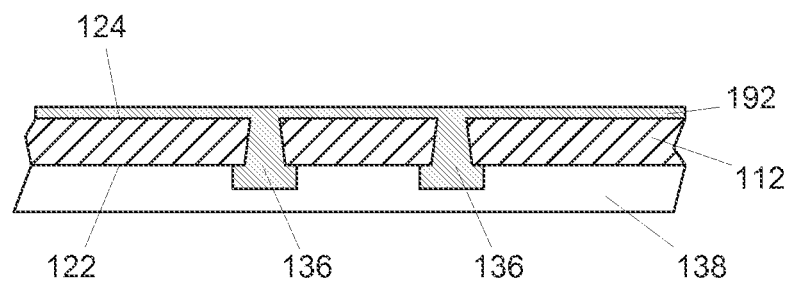
Figure 4F:
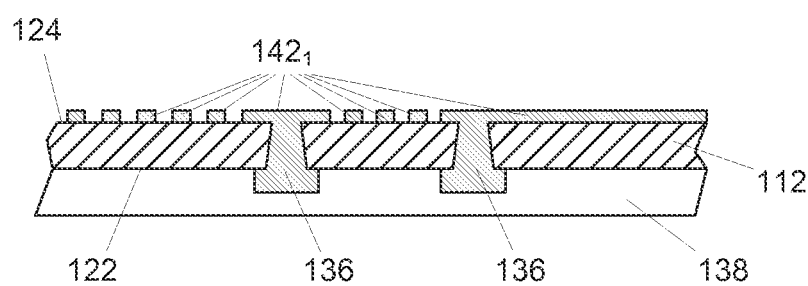

As shown in FIG. 4C, a second conductive material layer 194 may be formed on the first glass layer first surface 122 and in extending into the first glass layer openings 114 (see FIG. 4B) to contact the first conductive material layer 192. The second conductive material layer 194 may be patterned, such as by lithographic etching, to form the first through-glass contact structures 136, as shown in FIG. 4D. The first glass layer 112 may be flipped, the first carrier film 116 removed to expose the first conductive material layer 192, and the second carrier film 138 attached to the first glass layer second surface 124, as shown in FIG. 4E. The first conductive material layer 192 may be removed or used as a seed layer for the formation of the formation the first level conductive traces 144₁, as shown in FIG. 4F.

Figure 5A:
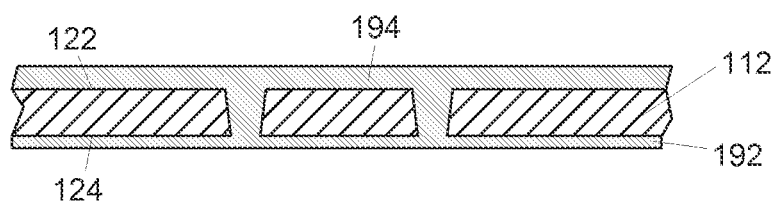
FIGS. 5A-5F illustrate side cross-sectional views of fabricating a substrate, according to still another embodiment of the present description.
Figure 5B:
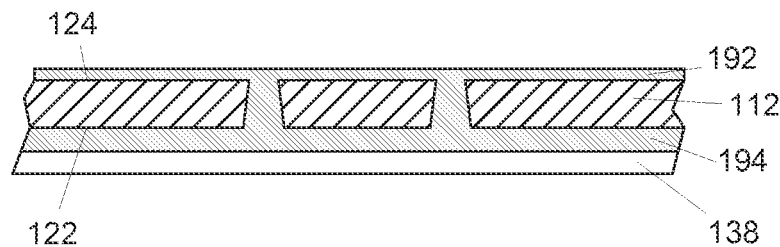
Figure 5C:
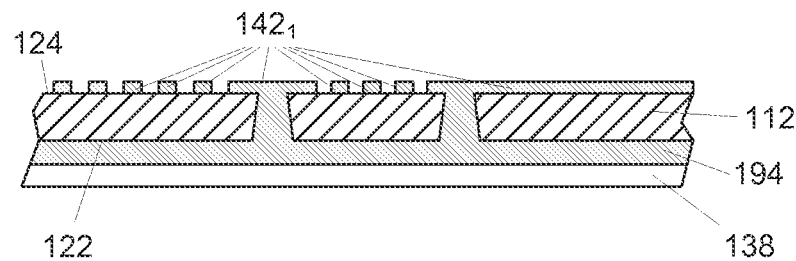
Figure 5D:
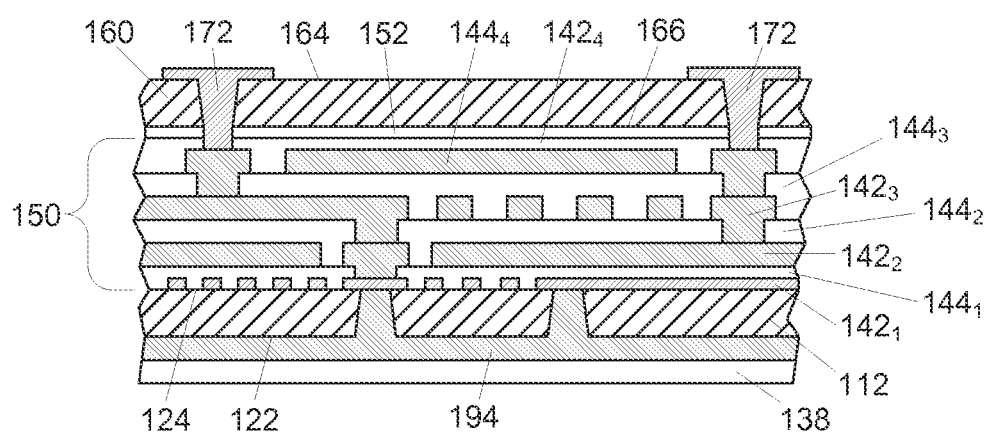
Figure 5E:
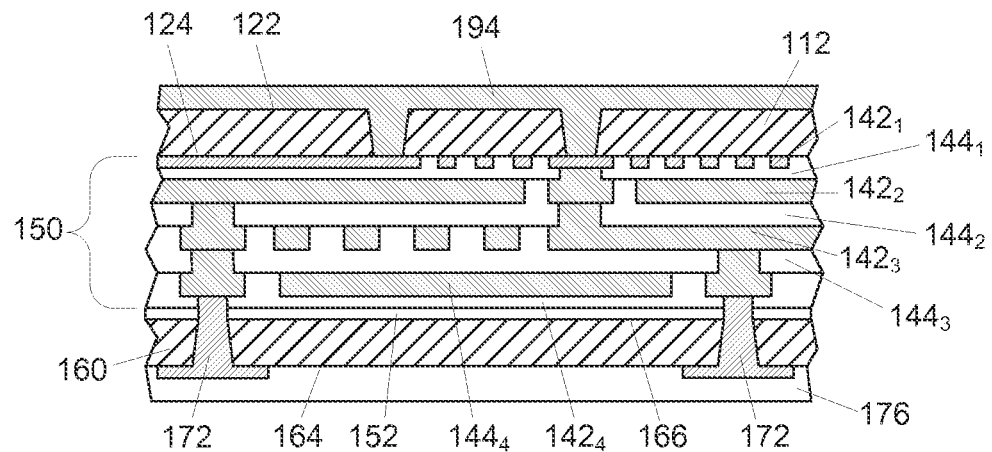
Figure 5F:
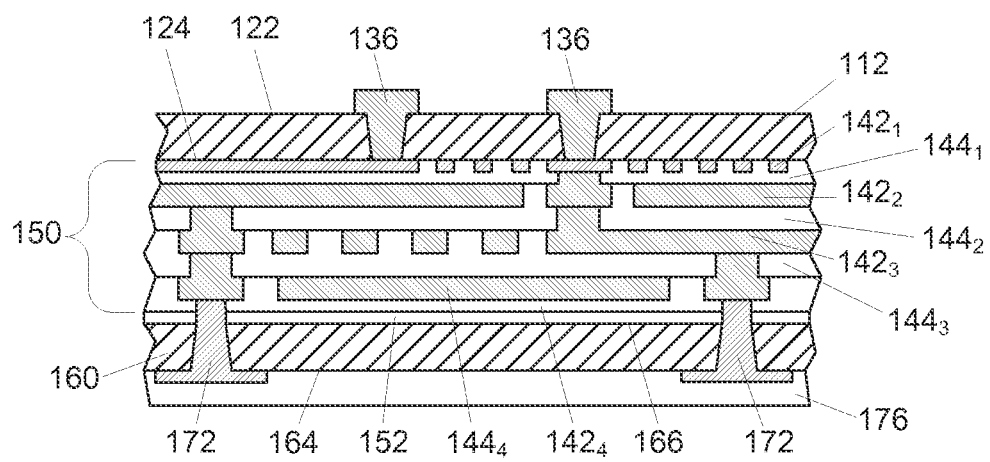

FIGS. 5A through 5F illustrate another embodiment of forming the microelectronic substrate 110, wherein the first through-glass contact structures 136 are formed after the attachment of the second glass layer 160 (see FIG. 3Q). As shown in FIG. 5A, the structure discussed and shown in FIG. 4C is provided. As shown in FIG. 5B, the second conductive material layer 194 is left intact and the second carrier film 138 is attached to the second conductive material layer 194. The first conductive material layer 192 may be removed or used as a seed layer for the formation of the formation the first level conductive traces 144₁, as shown in FIG. 5C. The processing steps illustrated in FIGS. 3I to 3P are performed to result in the structure shown in FIG. 5D. The structure of FIG. 5I) may be flipped, the first carrier film 116 removed to expose the second conductive material layer 194, and the third carrier film 176 may be attached to the second glass layer first surface 164, as shown in FIG. 5E. The second conductive material layer 194 may be patterned, such as by lithographic etching, to form the first through-glass contact structures 136, as shown in 5F.

Figure 6A:
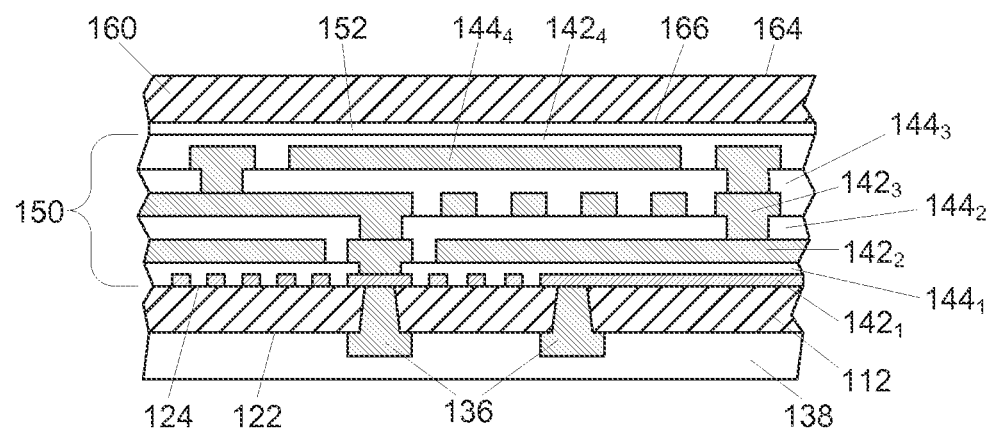
FIGS. 6A and 6B illustrate side cross-sectional views of fabricating a substrate, according to yet another embodiment of the present description.
Figure 6B:
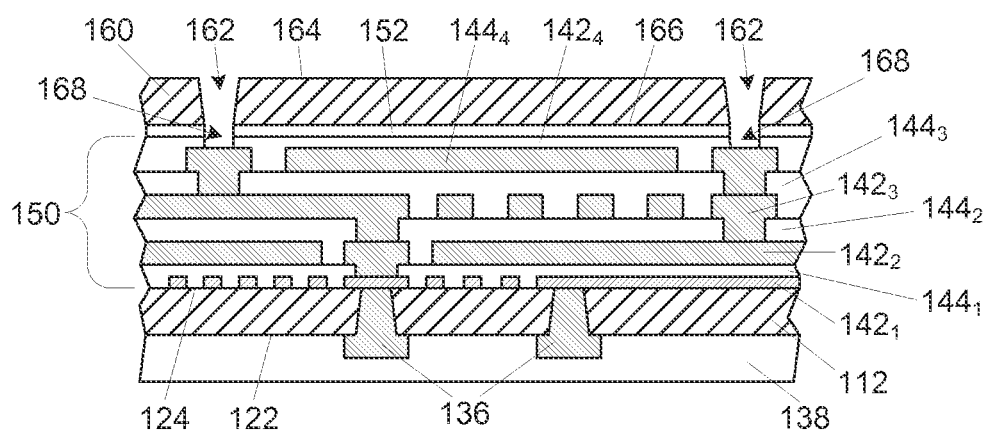

FIGS. 6A and 6B illustrate another embodiment of forming the second through-glass contact structures 172. Starting at FIG. 3M, the second glass layer 160 is attached to the trace routing structure 150 with the adhesive layer 152 prior to forming opening therein. After the attachment of the second glass layer 160, the second glass layer openings 162 are formed through the second glass layer 160 and the openings 168 are formed through the adhesive layer 152 and final level dielectric layer (illustrated as element 144₄), by any technique known in the art, including but not limited to laser ablation, dry etching, wet etching, powder blasting, and the like, wherein the final level conductive trace (illustrated as element 144₄) may act as an stop. The second through-glass contact structures 172 may be formed as discussed and shown with regard to FIG. 3P. By forming the second glass layer openings 162 after attaching the second glass layer 160, alignment of the second glass layer 160 is not required.

Figure 7:
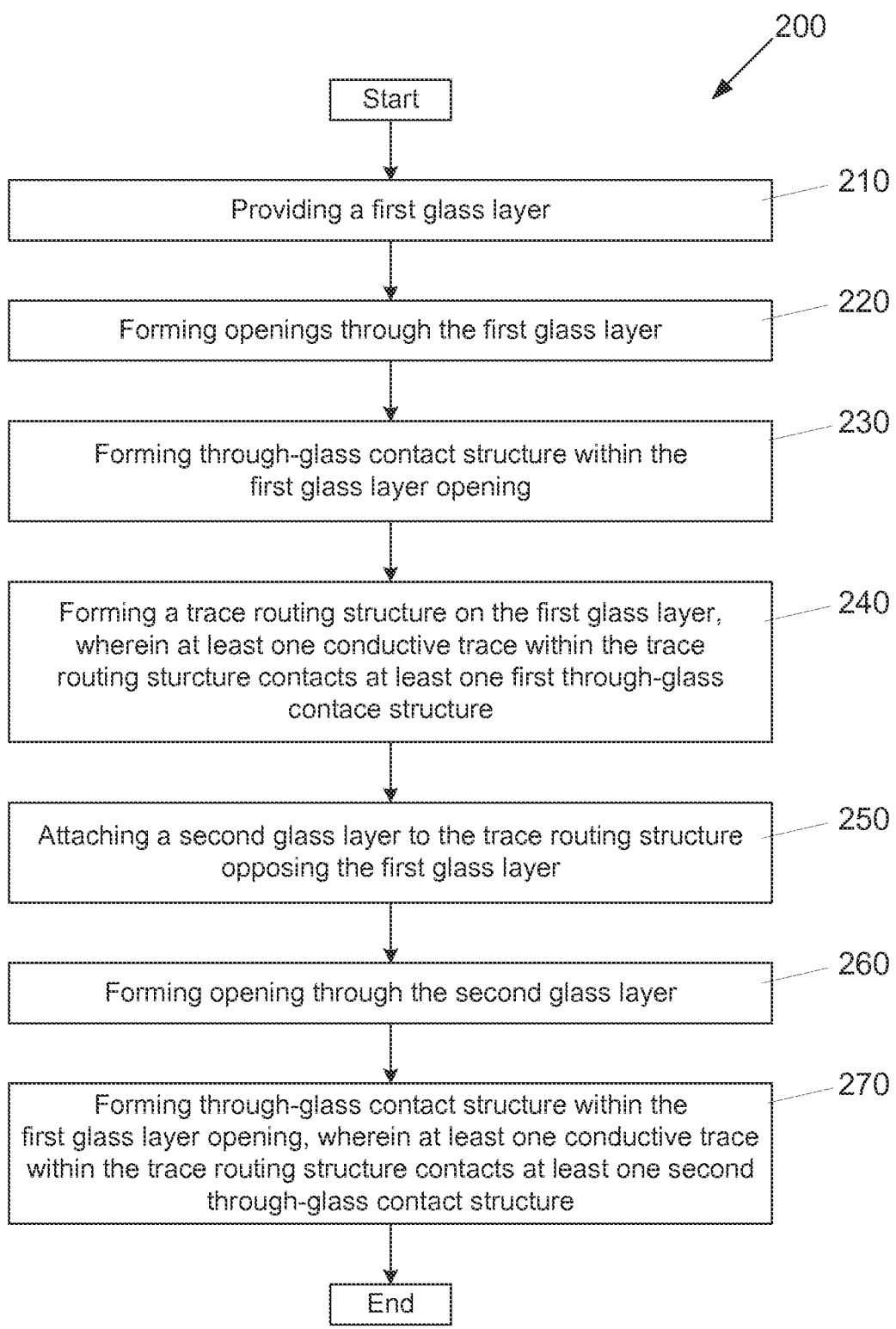
FIG. 7 is a flow diagram of a process of fabricating a microelectronic structure, according to an embodiment of the present description.

An embodiment of one process of fabricating a microelectronic structure of the present description is illustrated in a flow diagram 200 of FIG. 7. As defined in block 210, a first glass layer may be provided. At least one opening may be formed through the first glass layer, as defined in block 220. As defined in block 230, at least one first through-glass contact structure may be formed within the first glass layer openings. A trace routing structure may be formed on the first glass layer, wherein at least one conductive trace within the trace routing structure electrically contacts at least one first through-glass contact structure, as defined in block 240. As defined in block 250, a second glass layer may be attached to the trace routing structure opposing the first glass layer. At least one opening may be formed through the second glass layer, as defined in block 260. As defined in block 270, at least one second through-glass contact structure may be formed within the second glass layer openings, wherein at least one conductive trace within the trace routing structure may electrically contact the at least one second through-glass contact structure.

Figure 8:
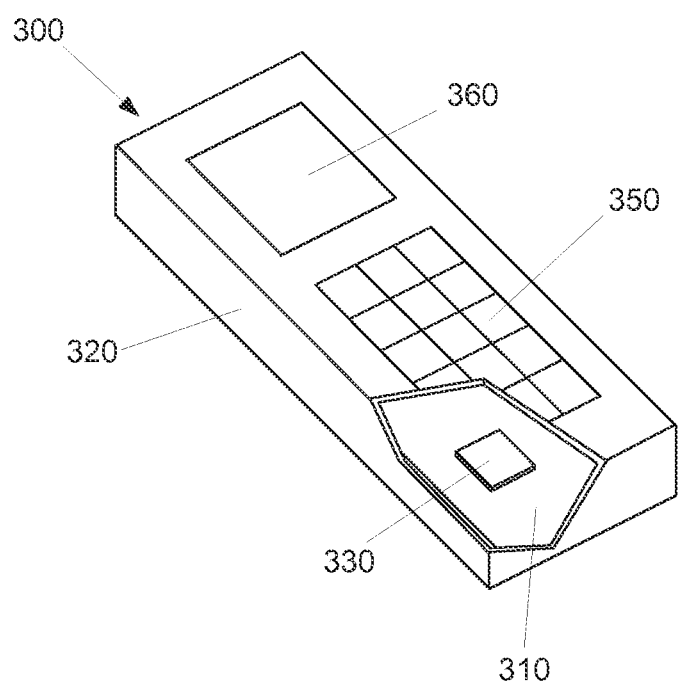
FIG. 8 illustrates an electronic system/device, according to one implementation of the present description.

FIG. 8 illustrates an embodiment of a electronic system/device 300, such as a portable computer, a desktop computer, a mobile telephone, a digital camera, a digital music player, a web tablet/pad device, a personal digital assistant, a pager, an instant messaging device, or other devices. The electronic system/device 300 may be adapted to transmit and/or receive information wirelessly, such as through a wireless local area network (WLAN) system, a wireless personal area network (WPAN) system, and/or a cellular network. The electronic system/device 300 may include a microelectronic motherboard 310 disposed within a device housing 320. A microelectronic package 330 may be attached to the microelectronic motherboard 310. As with the embodiments of the present application, the microelectronic package 330 may include a microelectronic substrate (not shown) comprising a trace routing structure disposed between opposing glass layers and a microelectronic device (not shown) attached to the microelectronic substrate (not shown). The microelectronic motherboard 310 may be attached to various peripheral devices including an input device 350, such as keypad, and a display device 360, such an LCD display. It is understood that the display device 360 may also function as the input device, if the display device 360 is touch sensitive.

It is understood that the subject matter of the present description is not necessarily limited to specific applications illustrated in FIGS. 1-8. The subject matter may be applied to other microelectronic structure fabrication applications, as well as to other applications outside of the field of microelectronic structure fabrication, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic substrate, comprising:
a first glass layer;
at least one first through-glass contact structure extending through the first glass layer;
a trace routing structure on the first glass layer, wherein at least one conductive trace within the trace routing structure electrically contacts at least one first through-glass contact structure;
a second glass layer may be attached to the trace routing structure opposing the first glass layer; and
at least one second through-glass contact structure, wherein at least one conductive trace within the trace routing structure electrically contacts the at least one second through-glass contact structure, wherein the first and second glass layer consist of pure silica.

2. The microelectronic substrate of claim 1, further including at least one additional glass layer disposed within the trace routing structure.

3. The microelectronic substrate of claim 1, wherein the trace routing structure comprises a plurality of dielectric layers and a plurality of conductive traces on and through the plurality of dielectric layers.

4. The microelectronic substrate of claim 1, further including at least one device-to-substrate interconnect attached to the at least one first through-glass contact structure.

5. The microelectronic substrate of claim 4, wherein the device-to-substrate interconnect comprises a solder bump.

6. The microelectronic substrate of claim 1, further including at least one external interconnect attached to the at least one second through-glass contact structure.

7. The microelectronic substrate of claim 6, wherein the external interconnect comprises a solder bump.

8. The microelectronic substrate of claim 1, further including an adhesive layer between the trace routing structure and the second glass layer.

9. A microelectronic substrate, comprising:
a first glass layer;
at least one first through-glass contact structure extending through the first glass layer;
a trace routing structure on the first glass layer, wherein at least one conductive trace within the trace routing structure electrically contacts at least one first through-glass contact structure;
a second glass layer attached to the trace routing structure opposing the first glass layer, wherein the first and second glass layer consist of pure silica;
at least one second through-glass contact structure, wherein at least one conductive trace within the trace routing structure electrically contacts the at least one second through-glass contact structure;
at least one additional glass layer disposed within the trace routing structure; and
wherein the microelectronic substrate has a thickness between about 100 and 200 μm.

10. A method of forming a microelectronic substrate, comprising:
providing a first glass layer;
forming at least one opening through the first glass layer;
forming at least one first through-glass contact structure within the first glass layer openings;
forming a trace routing structure on the first glass layer, wherein at least one conductive trace within the trace routing structure electrically contacts at least one first through-glass contact structure;
attaching a second glass layer to the trace routing structure opposing the first glass layer, wherein the first and second glass layer consist of pure silica;
forming at least one opening through the second glass layer; and
forming at least one second through-glass contact structure within the second glass layer openings, wherein at least one conductive trace within the trace routing structure may electrically contact the at least one second through-glass contact structure.

11. The method of claim 10, wherein attaching the second glass layer to the trace routing structure occurs prior to forming the at least one opening through the second glass layer.

12. The method of claim 10, wherein forming the at least one opening through the first glass layer comprises attaching the first glass layer to a first carrier and forming the opening through the first glass layer; and wherein forming at least one first through-glass contact structure within the first glass layer openings comprises forming a precursor layer on the first glass layer and each first glass layer opening, and plating a conductive material on the precursor layer.

13. The method of claim 10, wherein forming the at least one opening through the first glass layer comprises forming a first conductive material on a second surface of the first glass layer and attaching a first carrier to the first conductive material and forming the opening through the first glass layer; and wherein forming at least one first through-glass contact structure within the first glass layer openings comprises forming patterning a second conductive material in the first glass layer openings.

14. The method of claim 10, wherein forming at least one first through-glass contact structure occurs after forming at least one second through-glass contact structure.

15. The method of claim 10, wherein attaching the second glass layer to the trace routing structure comprises disposing an adhesive layer on the trace routing structure and disposing the second glass layer on the adhesive layer.

16. The method of claim 10, further including disposing at least one additional glass layer within the trace routing structure.

17. The method of claim 10, wherein forming the trace routing structure comprises forming a plurality of dielectric layers and a plurality of conductive traces on and through the plurality of dielectric layers.

18. The method of claim 10, further including forming at least one device-to-substrate interconnect in electrical contact with the at least one first through-glass contact structure.

19. The method of claim 18, wherein forming the at least one device-to-substrate interconnect comprises forming a solder bump in electrical contact with the at least one first through-glass structure.

20. The method of claim 10, further including forming at least one external interconnect, wherein one external interconnect is in electrical contact with one first through-glass contact structure.

21. The method of claim 20, wherein forming the at least one external interconnect comprises forming a solder bump, wherein the solder bump is in electrical contact with one first through-glass structure.

22. The method of claim 10, further including disposing an adhesive layer between the trace routing structure and the second glass layer.

23. A microelectronic system, comprising:
a housing;
a motherboard within the housing;
a microelectronic substrate attached to the motherboard, comprising:
   a first glass layer;
   at least one first through-glass contact structure extending through the first glass layer;
   a trace routing structure on the first glass layer, wherein at least one conductive trace within the trace routing structure electrically contacts at least one first through-glass contact structure;
   a second glass layer may be attached to the trace routing structure opposing the first glass layer, wherein the first and second glass layer consist of pure silica; and
   at least one second through-glass contact structure, wherein at least one conductive trace within the trace routing structure electrically contacts the at least one second through-glass contact structure;
and
at least one microelectronic device attached to the microelectronic substrate.

24. The microelectronic system of claim 23, further including at least one additional glass layer disposed within the trace routing structure.

25. The microelectronic system of claim 23, wherein the trace routing structure comprises a plurality of dielectric layers and a plurality of conductive traces on and through the plurality of dielectric layers.

26. The microelectronic system of claim 23, further including at least one device-to-substrate interconnect attached to the at least one first through-glass contact structure.

27. The microelectronic system of claim 26, wherein the device-to-substrate interconnect comprises a solder bump.

28. The microelectronic system of claim 23, further including at least one external interconnect attached to the at least one second through-glass contact structure.

29. The microelectronic system of claim 28, wherein the external interconnect comprises a solder bump.

30. The microelectronic system of claim 23, further including an adhesive layer between the trace routing structure and the second glass layer.

* * * * *